United States Patent [19]
Challa

[11] Patent Number: 5,408,431
[45] Date of Patent: Apr. 18, 1995

[54] SINGLE TRANSISTOR EEPROM ARCHITECTURE

[75] Inventor: Nagesh Challa, Sunnyvale, Calif.

[73] Assignee: Nexcom Technology, Inc., Sunnyvale, Calif.

[21] Appl. No.: 258,050

[22] Filed: Jun. 10, 1994

Related U.S. Application Data

[63] Continuation of Ser. No. 151,597, Nov. 12, 1993, which is a continuation of Ser. No. 973,809, Nov. 9, 1992, which is a continuation-in-part of Ser. No. 645,507, Jan. 24, 1991, Pat. No. 5,197,027.

[51] Int. Cl.$^6$ ............................................. G11C 13/00
[52] U.S. Cl. ...................... 365/185; 365/218; 365/189.04
[58] Field of Search ............ 365/185, 218, 189.01, 365/189.04, 189.09, 230.01

[56] References Cited

U.S. PATENT DOCUMENTS

| | | | |
|---|---|---|---|
| 4,758,986 | 7/1988 | Kuo | 365/185 |
| 4,958,321 | 9/1990 | Chang | 365/185 |
| 4,959,812 | 9/1990 | Momodomi et al. | 365/185 |
| 4,962,481 | 10/1990 | Choi et al. | 365/185 |
| 4,996,571 | 2/1991 | Kume et al. | 357/23.5 |
| 4,996,668 | 2/1991 | Paterson et al. | 365/185 |

FOREIGN PATENT DOCUMENTS

| | | |
|---|---|---|
| 0218342 | 4/1987 | European Pat. Off. |
| 0313427 | 4/1989 | European Pat. Off. |
| 0361972 | 4/1990 | European Pat. Off. |

OTHER PUBLICATIONS

M. Momodomi et al. "New Device Technologies for 5V-Only 4Mb EEPROM with NAND-Structure Cell," IEDM Tech Dig., 1988, pp. 412–415.

*Primary Examiner*—Terrell W. Fears
*Attorney, Agent, or Firm*—Skjerven, Morrill, MacPherson, Franklin & Friel; David H. Carroll

[57] ABSTRACT

A single-transistor EEPROM device of the present invention comprises memory transistors in banks similar to NAND structures wherein the control gates of the memory transistors have negative voltages applied in various modes that allow reading, writing, and programming regardless of the $V_{th}$ of nonselected memory transistors in a bank. Programming and erasing results from various combinations of negative and positive voltages are used on the select gates together with positive voltages less than that alone which is necessary to induce Fowler-Nordheim tunneling are applied to the bit lines.

24 Claims, 6 Drawing Sheets

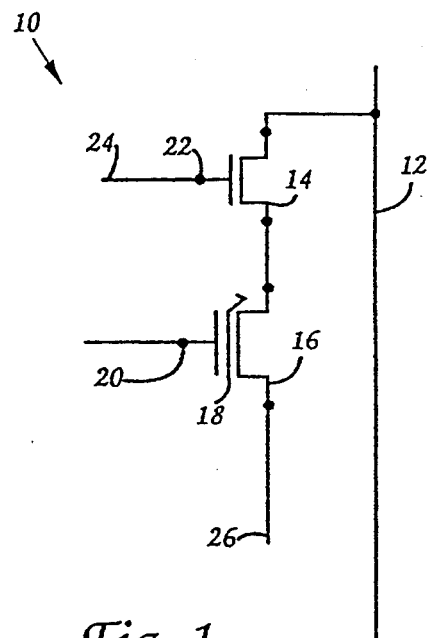
*Fig_1*
(prior art)
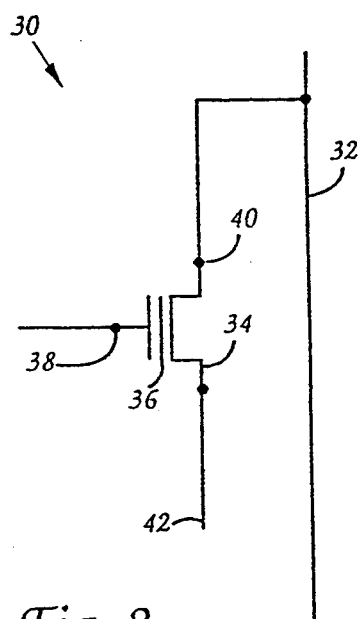
*Fig_2*
(prior art)

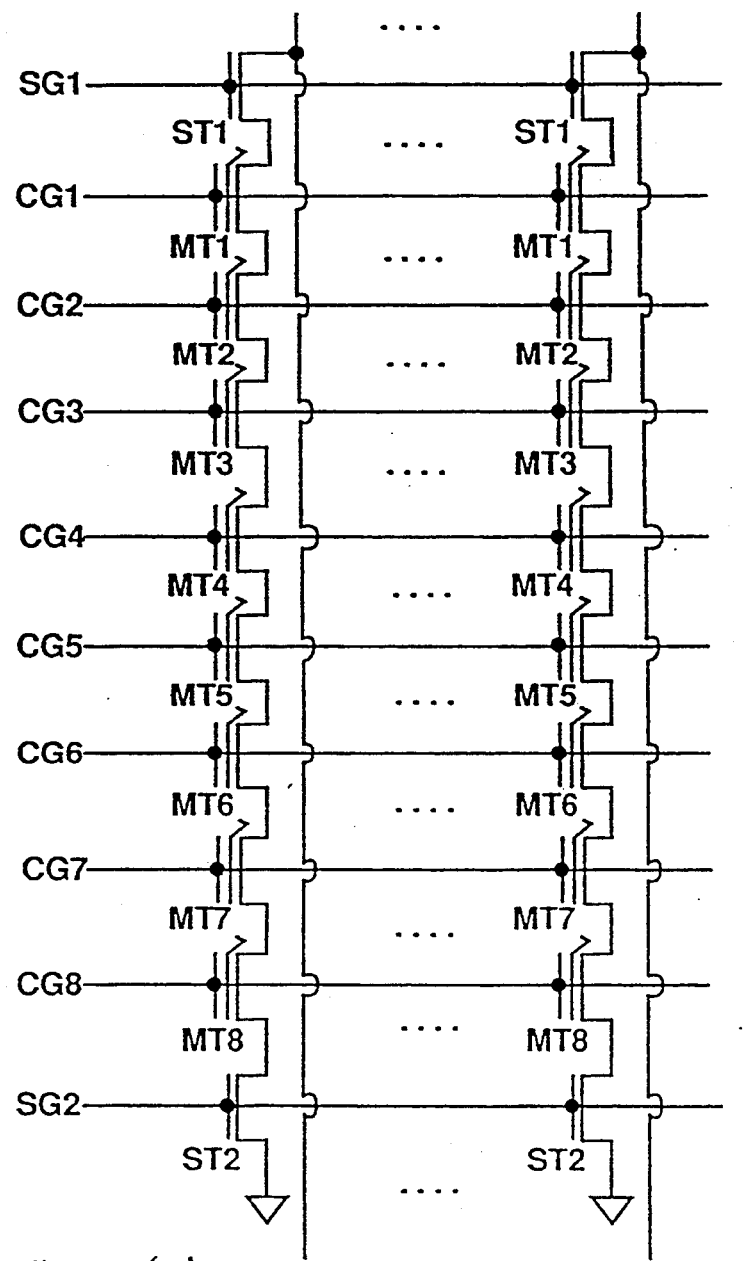
Fig_3(a)
(prior art)

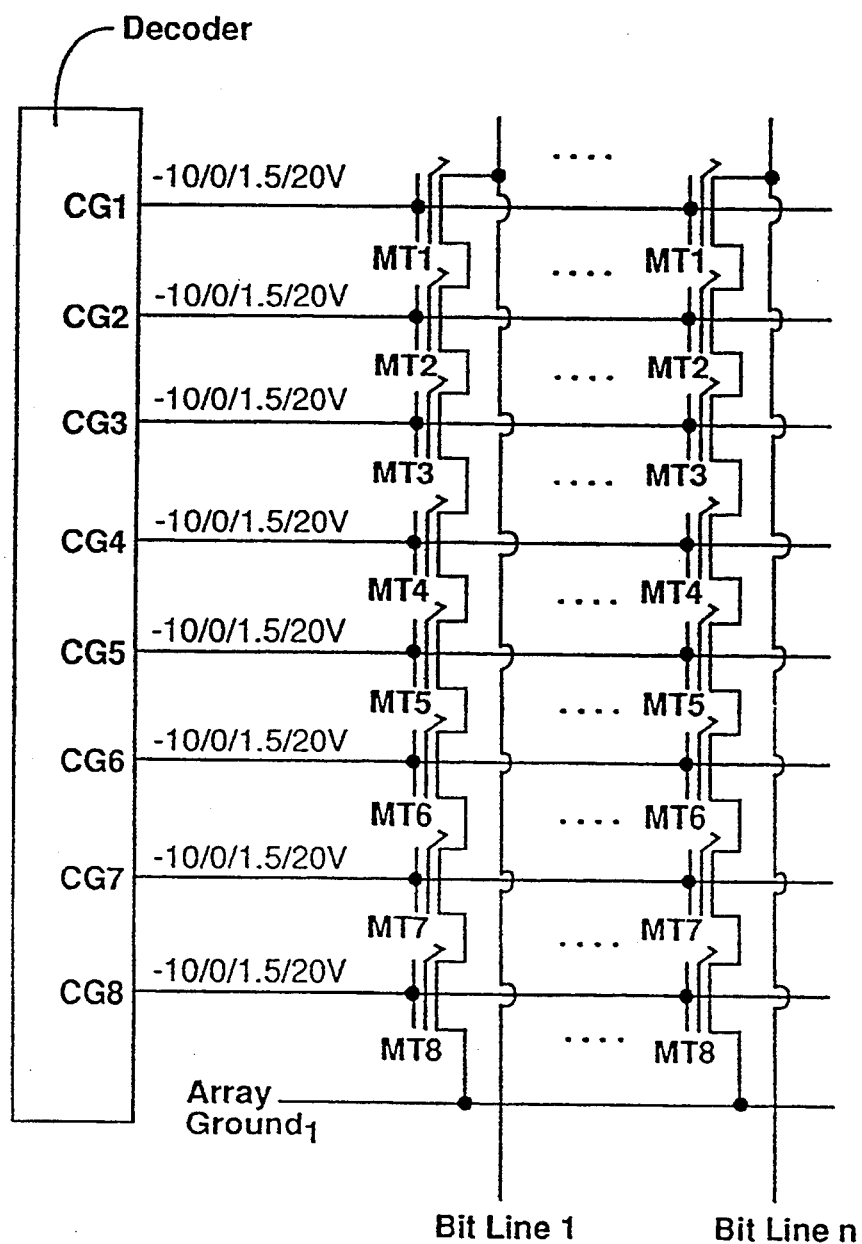
Fig_4(a)

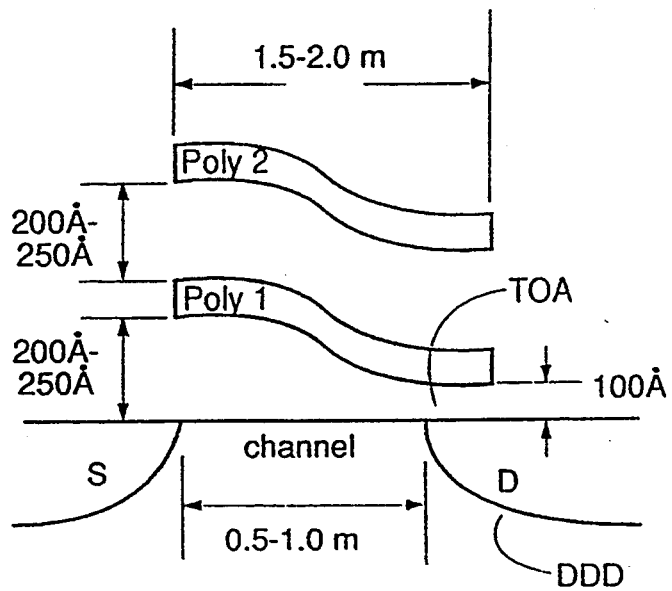
Fig_5(a)
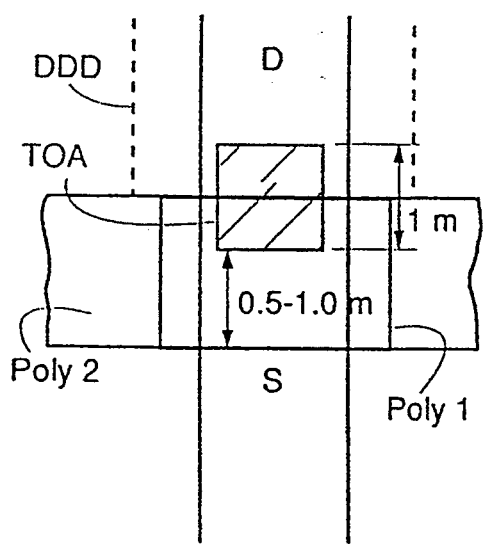
Fig_5(b)

SINGLE TRANSISTOR EEPROM ARCHITECTURE

CROSS-REFERENCE TO RELATED APPLICATION

This application is a continuation of U.S. patent application Ser. No. 08/151,597, filed Nov. 12, 1993; which is a continuation of U.S. patent application Ser. No. 07/973,809, filed Nov. 9, 1992; which is a continuation-in-part of U.S. patent application Ser. No. 07/645,507, filed Jan. 24, 1991, now U.S. Pat. No. 5,197,027.

BACKGROUND OF THE INVENTION

1. Field of the Invention

The invention relates generally to non-volatile computer memory devices and more specifically to very high density devices made possible by using one, as opposed to two, transistors per memory cell.

2. Description of the Prior Art

Electrically programmable read only memory (EPROM) cells are among the smallest memory cells in the prior art. Electrically erasable EPROMs (called E²PROMs) traditionally have had larger cell sizes because two transistors were necessary for each memory cell. Some so called "flash" EPROMs also have cells as small as EPROMs. Flash memories sort themselves into two basic approaches, distinguished by whether they require one or two voltage supplies. (See, Samuel Weber, "Look Out, Here Comes Flash," *Electronics*, Nov. 1990, pp. 44–50). These designs also differ in their cell structure—whether they require one or several transistors per cell. Intel Corporation (Santa Clara, Calif.) has a one-transistor self-aligned stacked-gate cell, based on its proprietary ETOX (EPROM tunnel-oxide) technology. Intel recently announced a very high density flash device, the 28F020, that stores two megabits. Catalyst, Excel, Hitachi, Mitsubishi, and Toshiba all offer competing devices. A problem with the single-transistor cell is the possibility of over-erasure and consequent current leakage. This can result in false data readings when a cell in the zero state receives an erase pulse that drives it into the depletion mode. The column-sense amplifier will read this incorrectly as an erased cell. Intel, and others, have overcome this with a programming algorithm that first programs up all the cells on a chip to a "one" before erasing. Seeq Technology (San Jose, Calif.) solves the problem by using a different cell structure. A split-gate cell amounts to a two-transistor architecture, but takes only a little more chip area than a single transistor cell. (According to Weber, supra.) Through a diffusion process, the split-gate creates a phantom transistor that looks like a series transistor. This allows the cell to be isolated from others in a column. The Seeq devices (e.g., 48F512 and 48F010) have the ability to do sector-erase of any of 128 columns.

FIG. 1 illustrates a typical EEPROM memory cell 10 of the prior art comprising a bit line 12, a select transistor 14, a floating gate transistor 16 having a floating gate 18 and a control gate 20, a select gate 22 connected to a word line 24, and an array source 26. Transistor 16 is a floating-gate avalanche-injection metal oxide semiconductor (FAMOS) and is well known in the prior art. (For a background of these devices see, U.S. Pat. No. 4,884,239, issued Nov. 28, 1989, to Ono, et al.) To erase cell 10, a high voltage (about 20V)-is placed on gates 20 and 22, while array source 26 and bit line 12 are at ground. The high voltage on gate 20 is coupled to floating gate 18 by virtue of capacitive coupling. The voltage on gate 18 is a function of the coupling ratio gamma. (Depending on the technology used, the coupling ratio will vary, and so will the voltages used.) Therefore $V_{18} = \text{gamma} * V_{20}$. Once $V_{18}$ reaches a critical level (typically ~11V) the field across the tunnel oxide area of transistor 16 is enough to start electron tunneling from the drain of transistor 16 to gate 18 through the thin (~100Å) tunnel oxide. This results in a relatively high threshold voltage ($V_{th}$) for transistor 16. To program cell 10, control gate 20 is grounded, high voltages (~20V) are placed on bit line 12 and select gate 22, while array source 26 is left to float. The high voltage on bit line 12 transfers through transistor 14 to the drain of transistor 16. An electric field is produced across the tunnel oxide area of transistor 16 to start tunneling of electrons in the direction opposite to the above. This results in transistor 16 having a low threshold voltage ($V_{th}$, which can be −2V to −3V). This threshold voltage is the reason that transistor 14 is needed in read mode because transistor 16 cannot be reliably controlled for reading by gate 20. Since a high voltage on only one terminal, control gate 20 or the drain of transistor 16, is needed to program and erase, the select gate 22 is needed for these modes.

FIG. 2 illustrates a prior art single-transistor flash EPROM memory cell 30 comprising a bit line 32 and a memory transistor 34 having a floating gate 36, a control gate 38 connected to a word line, a drain 40, and an array ground 42. To erase cell 30, control gate 38 and bit line 32 have a high voltage (~12V to 15V) applied. This puts transistor 34 in a high current mode drawing about one milliamp from bit line 32 to array ground 42. Hot electrons are generated and get trapped in floating gate 36. (This is the standard EPROM programming mode.) To program cell 30, control gate 38 is grounded and array ground 42 is at high voltage. Bit line 32 is floating and electrons tunnel through the thin gate oxide of transistor 34 to array ground 42. This results in a low $V_{th}$ state for transistor 34.

A pass transistor can prevent memory cells from drawing current when the floating gate structure is erased into depletion. (See, Gill, et al., "A 5-Volt Contactless Array 256KBIT Flash EEPROM Technology," IEDM 88, IEEE, pp. 428–431.) Such pass, or read select, transistors are routinely used in the prior art. A contactless cell array technology is described by Gill, et al. (supra), for a single power supply 5V-only flash EEPROM. The contactless flash EEPROM cell is a one-transistor floating gate structure (defined by double poly stack process) merged with a series enhancement pass gate. The cell erase is accomplished by Fowler-Nordheim tunneling from floating gate to source junction by applying a negative voltage on the word line and Vcc=5V on the source line (Id., FIG. 4). There is no significant change in the erased state threshold voltage because of the merged pass gate. Since the floating gate structure can be over-erased into depletion, the cell $V_{th}$ is dominated by the pass gate characteristics.

The prior art has developed a method of combining eight memory transistors in a bank having only two select transistors. These structures save as many as six transistors in an eight-bit memory bank, and are known as NAND structure cells. (See, Momodomi, et al., "New Device Technologies for 5V-Only 4Mb EEPROM With NAND Structure Cell," IEDM 88, 1988, pp. 412–415 [ULSI Research Center, Toshiba Corp., Japan].) NAND structure cells have been nominated as the most promising ultra high density EEPROM that is capable of replacing magnetic memories, such as floppy disk. By using one micron design rules, cell units as small as 12.9 square microns per bit are possible, which is good enough to fabricate a 4 Mb EEPROM. A Toshiba paper presented to the 1990 IEDM conference, revealed an experimental 16 Mb NAND EEPROM having a bit cell area that has been squeezed down to 2.3 square microns. (Bursky, et al., "IEDM Unveils the Latest Semiconductor Advances, Electronic Design, Vol. 38, No. 22, Nov. 22, 1990, pp. 39–51.) The new, smaller cell is reported to have used a new self-aligned stacked-gate pattern, a new high-voltage field isolation technology, and a larger NAND string of sixteen memory bits. The main features of the NAND structure cell are that they have a wide threshold voltage window achieved by a new programming operation, and tolerate successive program/erase operations by using high voltage CMOS processes.

FIG. 3(a) shows a NAND structure of eight memory transistors MT1–MT8, having respective control gates CG1–CG8, connect their drains and sources in series with one another and two select transistors ST1–ST2 having select gates SG1–SG2. FIG. 3(b) is a layout of the NAND structure of FIG. 3(a) and FIG. 3(c) is a cross-sectional view of the layout. The process and device parameters are given in Table I.

TABLE I

| Technology | N-Well CMOS | |
| --- | --- | --- |
| | Triple Level Poly-Si | |
| | Single Aluminum Layer | |
| Gate Length | Memory Cell | 1.0 micron |
| | Select | 1.5 micron |
| | NMOS | 2.0 micron |
| | PMOS | 2.5 micron |
| Oxide Thickness | Transistor | 400 Å |
| | Memory Cell | 100 Å |

Select transistor SG1 ensures the selectivity, and SG2 prevents current from passing during programming operation. (Momodomi, et al., supra.) Each memory cell has therefore only one memory transistor, a quarter of a select transistor, and a sixteenth of a contact hole area per bit. The NAND structure can be fabricated by conventional self-aligned double poly silicon gate technology. A typical 4 Mb EEPROM is composed of 256×2048 NAND structure cell arrays.

In the NAND structure described by Momodomi, et al., (supra) the cell is programmed and erased by Fowler-Nordheim tunneling. The current dissipation during these operations is therefore very small. To erase, 17V is applied to the control gates while the bit lines are grounded. All cells in a block are erased simultaneously. The threshold voltage ($V_{th}$) of erased cells becomes an enhanced mode at approximately 2V after one millisecond erasing time. To program, 22V is applied to the nonselected control gates and the selected bit lines, while the selected control gate is grounded. Half of the programming voltage (11V) is applied to the nonselected bit lines in order to keep the $V_{th}$ of the nonselected cells.

U.S. Pat. No. 4,959,812, issued Sep. 25, 1990, to Momodomi, et al., describes an erasable programmable read-only memory with NAND cell structure which has memory cells provided on an n-type substrate. The memory cells are divided into NAND cell blocks each having a series array of memory transistors. Each of the transistors has a floating gate, a control gate connected to a word line and n-type diffusion for the source and drain. These diffusions are formed in a p-type well in the surface of the substrate. The well serves as a surface breakdown prevention layer. During a data erase, data stored in all of the memory cells is erased simultaneously. During data write, which is subsequent to erase, a certain NAND cell is selected and memory transistors within the NAND cell block are written in a hierarchical sequence. (Unprogrammed cells nearer the selection transistor interfere with the writing operation.) When data is written, the respective control gate is supplied with a voltage high enough to form an electric field that will promote tunneling of electrons between the floating gate of the memory transistor and the well layer. Consequently, only the selected cell is written into.

An "EPROM Device with Plurality of Memory Strings Made of Floating Gate Transistors Connected in Series" is the subject of U.S. Pat. No. 4,962,481, issued Oct. 9, 1990, to Jung-Hyuk Choi, et al. This device has a plurality of memory strings arranged in a single column respectively disposed at both sides of each column line and an upper and lower row between reference lines. A single select transistor is used in each string.

The disadvantages of the prior art for EEPROM are that select transistors are needed, making high density difficult, and bit lines have high voltages on them causing spacing concerns between adjacent lines. In flash EPROMs the problems are again high voltages being placed on bit lines, high currents needed to program memory cells, and a loss of the page mode of operation because too much current is needed. Often, the write operation can produce negative thresholds and complicated algorithms are necessary to work around the problem.

SUMMARY OF THE PRESENT INVENTION

An advantage of the present invention is that high density memory arrays can be achieved that have the programming and reading simplicity of prior art E²-PROM devices.

Another advantage of the present invention is that lower voltages can be used.

Another advantage of the present invention is that select transistors are eliminated.

Another advantage of the present invention is that the need to submit a flash memory cell to a high current hot electron injection mode is eliminated, thus reducing overall programming current.

These and other advantages are achieved in the present invention, which in one embodiment is a programmable erasable memory comprising a bit line, a reference voltage point, a plurality of memory cells such as EEPROM devices, and a decoder. The memory cells are serially connected by their current terminals, typically drains and sources, to form a string. One of the current terminals of the first memory cell in the string, for example the drain, is directly connected to the bit line, while one of the current terminals of the last memory cell in the string, for example the source, is connected to the reference voltage point. The decoder has a plurality of outputs respectively connected to the control terminals of the memory cells, and is operable to address one of the cells to set the threshold thereof, while causing other memory cells intervening between the addressed memory cell and the bit line to be conductive.

IN THE DRAWINGS

FIG. 1 is a schematic diagram of a prior art E²PROM memory cell.

FIG. 2 is a schematic diagram of a prior art EPROM or FLASH memory cell.

FIG. 3(a) is a schematic diagram.

FIG. 4(a) is a schematic diagram.

FIG. 5(a) is a cross-section and FIG. 5(b) is a layout of a preferred memory transistor for the NAND structure of FIGS. 4(a)-(c).

DETAILED DESCRIPTION OF THE PREFERRED EMBODIMENTS

Figure 3B:
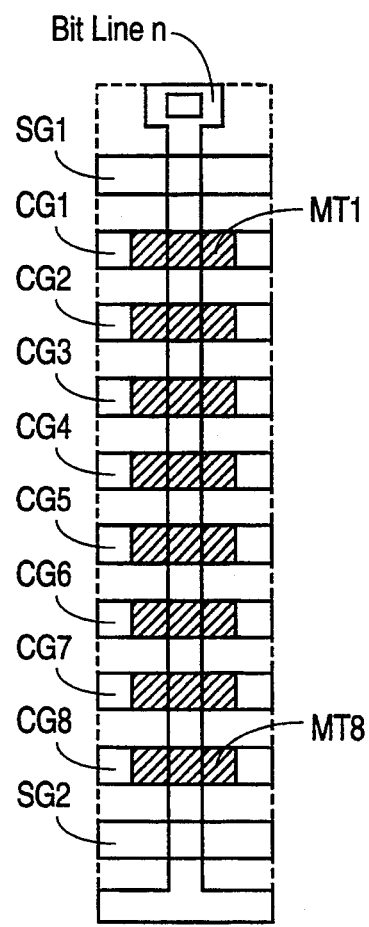
FIG. 3(b) is a layout.
Figure 3C:
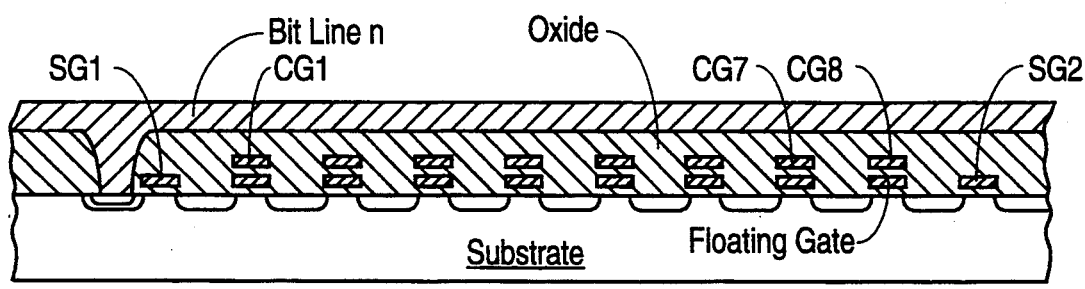
FIG. 3(c) is a cross-sectional diagram of a prior art NAND structure.

FIG. 4 illustrates a pair of NAND structures of the present invention. A first and an "nth" NAND structure are shown. Each NAND structure consists of eight memory transistors MT1-MT8 connected in series (drain-to-source) with the top end of the string connected to a bit line and the bottom end of the string connected to ground. Each memory transistor has a source, a drain, a control gate respectively connected to CG1-CG8, and a floating gate. The gate oxide between the floating gate and channel between the drain and source is approximately 100Å. This thickness is such that tunneling of charge can take place between the floating gate and drain. The drain diffusion is such that there is an under-lap below the floating gate. Thus the tunnel window of this memory transistor is the area between the floating gate and the under-lap drain diffusion. An isolated charge on the floating gates determines the threshold voltage ($V_{th}$), +2V or −2V, of the respective memory transistors, and as such is the basic mechanism for storing the data. Fowler-Nordheim tunneling is used to both erase and write data (charges) into the floating gate.

In principle, Fowler-Nordheim tunneling is used to erase and store in the following manner. To erase or program a memory transistor on a selected word line, the under-lap region below the floating gate is connected to bit line 1 or array ground 1 or both, depending on the memory cell arrangement and voltages used, by turning ON any intervening memory transistors. For example, if memory devices having drain diffusion under-lap are used and CG4 is selected, memory transistor MT4 on bit line 1 is erased by turning ON memory transistors MT1-MT3 on bit line 1, and by placing a sufficient potential difference between CG4 and the bit line 1 so that the floating gate of MT4 receives sufficient negative charge through the mechanism of Fowler-Nordheim tunneling. Similarly, memory transistor MT4 on bit line 1 is programmed by turning ON memory transistors MT1-MT3 on bit line 1, and by placing a sufficient potential difference between CG4 and the bit line 1 so that any negative charge on the floating gate of MT4 is drained through the mechanism of Fowler-Nordheim tunneling. In the case of erasure, tunneling is enhanced and current drain avoided by bringing the array ground 1 to the same potential as the bit line 1, and turning ON memory transistors MT5-MT8, the memory transistors intervening between MT4 on bit line 1 and the array ground 1.

In one specific embodiment, four voltage levels are available for use on each of the control gates CG1-CG8: −10V, 0V, 10V, and 20V. Three voltages are available for use on each bit line: 0V, 1.5V, and 5V. The appropriate voltages to apply to CG1-CG8 and the bit lines depends on the mode, which is erase, write, or read, and whether the NAND structure is selected or not. These voltages are summarized in Table II for the exemplary case of erasing, writing, and reading MT4 in a selected NAND structure such as the NAND structure in the first column connected to bit line one. Advantageously, other NAND structures sharing the same ground array line as the selected NAND structure need not participate in the erase or program operations. The voltages for avoiding programming and erasure of a memory transistor on a selected word line, e.g. CG4, in a NAND structure are also summarized in Table II. Table III shows the conditions existing for nonselected NAND structures.

TABLE II

| Control | Condition | ERASE | WRITE | READ |
|---|---|---|---|---|
| Bit Line₁ | sel/off | 0V/float | 5V/float | 1.5V/N.A. |
| CG1 | off | 5V | 10V | 5V |
| CG2 | off | 5V | 10V | 5V |
| CG3 | off | 5V | 10V | 5V |
| CG4 | selected | 20V | −10V | 0V |
| CG5 | off | 5V | 10V | 5V |
| CG6 | off | 5V | 10V | 5V |
| CG7 | off | 5V | 10V | 5V |
| CG8 | off | 5V | 10V | 5V |
| array ground₁ | selected | 0V | 5V | 0V |

The selected memory transistor will have, as its drain voltage, the voltage of the bit line which is passed through by the nonselected memory transistors. The threshold voltage $V_{th}$ for erase is +2V and −2V for write. To erase a memory cell, e.g., MT4 on bit line one, CG4 is raised to 20V, CG1-CG3 and CG5-CG8 are set to 5V, and bit line one is grounded. Placing 5V on CG1-CG3 and CG5-CG8 turns on MT1-MT3 and MT5-MT8 and their respective drain-to-source resistances drop to a low ON value. Since both ends of the NAND structure string are at 0V, then the source and drain of MT4 will be at 0V. The difference across the control gate and drain of MT4 will be about 20V, more than enough to cause Fowler-Nordheim tunneling of electrons from the drain to the floating gate of MT4. The $V_{th}$ of MT4 will therefore become +2V (the programming time is also adjusted to guarantee this also).

The charge assumed by the floating gate will partly depend on the capacitive coupling ratio, $\gamma$ (or gamma), where $$\gamma = C_1/(C_1 + C_2) \quad (1)$$

The capacitance between the control gate and floating gate is $C_1$, and the capacitance between the floating gate and drain+source+substrate is $C_2$. Preferably, $\gamma$ is in the range 0.50 to 0.55. The coupling ratio $\gamma$ and the programming time are adjusted such that ±10V on the control gate and 0V on the drain will not cause an appreciable change in $V_{th}$. If the control gate voltage is $V_{cg}$, and the floating gate voltage is $V_{fg}$, then $$V_{fg} = \gamma V_{cg} \quad (2)$$

Since the onset of Fowler-Nordheim tunneling depends on an adequate voltage on the floating gate, the actual voltages given in Tables II and III will be directly controlled by the coupling ratio gammas of the memory transistors. Hence, the above voltages are only exemplary, and not to be considered absolute. The better the coupling ratio γ, the lower can be the programming voltage on the control gates.

Note that memory transistors MT1–MT3 and MT5–MT8 do not erase because their control gates have only 5V applied. Note also that transistors MT1–MT8 in the $n^{th}$ column connected at the top end to bit line "n" do not erase because bit line "n" is floating. Note also that during erase, Fowler-Nordheim tunneling is assisted in memory transistor MT4 on bit line 1 by a further "underlapping" region, namely the channel that is induced when the source and drain are brought to the same potential while a large positive voltage is applied to the control gate.

The write operation is just the opposite. Plus 10V is applied to the control gates of MT1–MT3 and MT5–MT8 to bias them ON in view of the fact bit line one is raised to 5V. Plus 5V therefore couples through the series string to the drain of MT4. Control gate CG4 has a −10V applied which will cause Fowler-Nordheim tunneling in the reverse direction, relative to erasing. The programming time is chosen so that the $V_{th}$ of MT4 becomes −2V as a result.

For reading, the selected bit line is set to 1.5V and the selected control gate CG4 is set to 0V. The other control gates are set to 5V so that their respective transistors are ON (regardless of their respective $V_{th}$) and the $V_{th}$ of MT4 controls whether MT4 is ON or OFF (because the control gate set to 0V will not override $V_{th}$). If MT4 is ON, the voltage of the array ground will couple through, otherwise the sense voltage of 1.5V on bit line one will be read as a high (MT4 OFF).

In Table III, nonselected bit lines are set to floating, floating, and 0V, respectively, for erase, write, and read. Non-selected array grounds are also set to 0V, 0V and 0V, respectively for erase, write, and read. This ensures that a NAND structure string on a nonselected bit line and a selected array ground, and/or a NAND structure string on a selected bit line (0V and 5V respectively for erase and write) and a nonselected array ground, will not be erased, written, or read, in sympathy with the selected NAND structure string. A NAND structure string on a nonselected bit line and a nonselected array ground will, of course, be doubly isolated.

TABLE III

| Control | Condition | ERASE | WRITE | READ |
|---|---|---|---|---|
| Bit Line$_n$ | off/sel | float/0V | float/5V | 0V/1.5V |
| CG9 | off | 0V | 0V | −3V |
| CG10 | off | 0V | 0V | −3V |
| CG11 | off | 0V | 0V | −3V |
| CG12 | off | 0V | 0V | −3V |
| CG13 | off | 0V | 0V | −3V |
| CG14 | off | 0V | 0V | −3V |
| CG15 | off | 0V | 0V | −3V |
| CG16 | off | 0V | 0V | −3V |
| array ground$_n$ | off | 0V | 0V | 0V |

The substrate bias potential may be adjusted to minimize the peak voltage used by the NAND structures, especially during erase. Consider, for example, a memory transistor using a potential difference of twenty volts across the control gate and drain for erasure. A grounded substrate embodiment using this memory transistor requires the application of zero volts to the drain and twenty volts to the control gate, which calls for a twenty volt supply. In an alternative embodiment in which the substrate bias is adjustable, reducing the substrate bias during erase from zero potential to a negative potential permits lowering the potential on both control gate and on the drain of the transistor being erased. This is because in an n-channel transistor, the lowering of the substrate bias ensures that the substrate-drain junction is not forward biased. For example, if the substrate bias is reduced to minus five volts, both the control gate and drain potentials are reduced by five volts, to fifteen volts and minus five volts respectively. Advantageously, the peak voltage requirement is reduced to fifteen volts. The control gates of the nonselected transistors need not be brought to five volts, but instead are brought to zero volts or left floating.

FIG. 5 illustrates an improved memory transistor having a source, a drain, a channel in between the source and drain, a floating gate (alternatively called "poly 1"), a silicon dioxide dielectric, and a control gate (alternatively called "poly 2"). The drain is a deep diffusion drain (DDD). The diffused junction area under the tunnel implant area (also called TOA) is typically formed by a special tunnel implant which is not self-aligned to the polysilicon gate (as a normal source or drain would be). But is implanted using a special masking step such that a diffused junction is formed under the floating gate. The controlgate is separated from the floating gate by 200Å–250Å of silicon dioxide. The capacitance between the two gates is referred to below as $C_1$. The floating gate is separated from the channel/drain by 200Å–250Å at one end and 100Å at the other end. The 100Å area that the floating gate overlaps the drain is the tunnel oxide area (TOA). The capacitance between the floating gate and the channel/drain/source is referred to below as $C_2$.

Figure 4B:
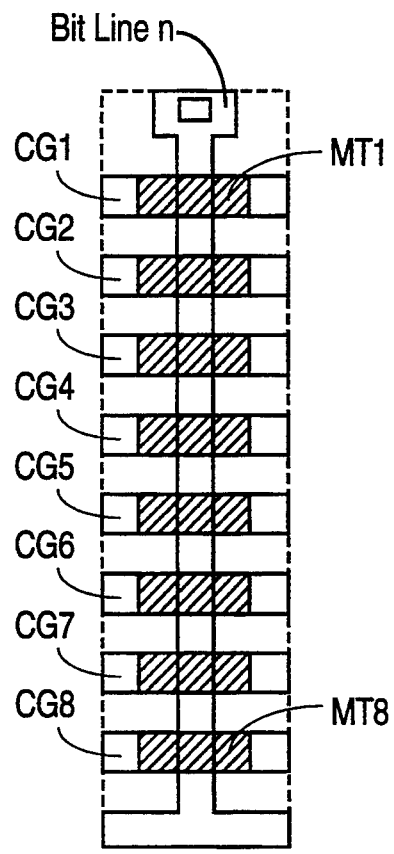
FIG. 4(b) is a layout.
Figure 4C:
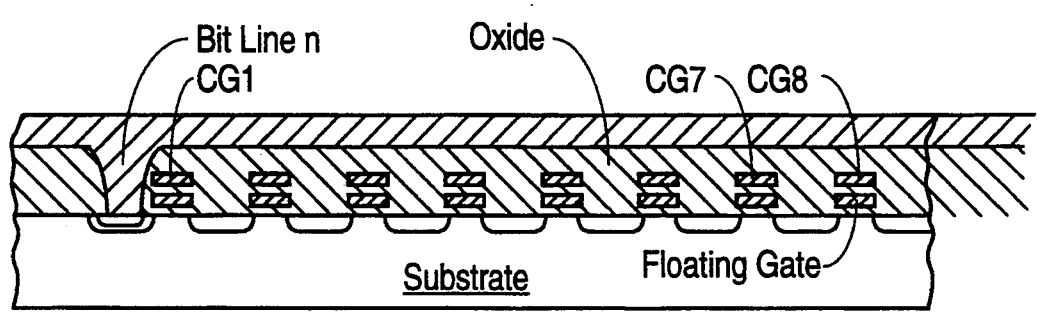
FIG. 4(c) is a cross-sectional diagram of a NAND structure of the present invention.

The memory transistor of FIGS. 5(a)–(b) is preferred for use in the NAND structure of FIGS. 4(a)–(c) because it simultaneously achieves a small cell geometry, on the order of 1.5 microns, and has a high coupling capacitance ratio γ of 0.50 to 0.55. Higher gammas allow lower programming voltages because more of the programming voltage will couple to the floating gate. About 11V is needed to support Fowler-Nordheim tunneling in a 100Å thick tunnel oxide area. Given a maximum programming voltage of 20V, γ is 0.55 (applying formulas one and two, above). Capacitance $C_2$ therefore is no greater than $C_1$. The capacitance between two plates, given a fixed dielectric between them, increases when the plates are brought closer together or when the area of the plates is increased, or both. Increasing the capacitance of $C_1$ by increasing the size of the gates runs contrary to goal of having small cell sizes. Increasing the capacitance of $C_1$ by decreasing the distance between the gates causes problems because the programming voltage on the control gate could breakdown the oxide between the gates. Decreasing the capacitance of $C_2$ is an alternative. However, the distance from the floating gate to the channel/drain cannot be increased, because the tunnel oxide area (TOA) preferably is 100Å thick for tunneling to occur.

The solution, shown in FIGS. 5(a)–(b) is to have the floating gate droop from 200Å–250Å over the channel to 100Å over the drain. The control gate follows this droop to avoid a decrease in capacitance $C_1$ that would result otherwise. The TOA is preferably one micron square, with half of that area extending over the drain.

With a channel width of one half to one micron, the technology is not pushed in terms of lithography, but effectively a transistor with a half micron channel length and half micron tunnel oxide is realized. The TOA is such that only half of it is actually under "Poly 1". This way a small area for the TOA is achieved at the same time facilitating a TOA for the cell without pushing the state of the art in lithography. The deep diffusion drain (DDD) can alternatively be such that the resulting drain underlaps the "Poly 1" in the TOA. The channel area is alternatively such that the drain and TOA overlap on one side and the source diffusion on the other side.

Referring once again to FIG. 4(a), the source and drain of alternating transistors (e.g., MT1–MT8) can be reversed such that drain connects to drain and source connects to source. In this embodiment during a program operation, several NAND structures sharing the same array ground line may have 5V applied to the shared ground line, even though not all of the selected transistors in the NAND structures are to be programmed. To avoid unintentional programming through the shared ground line, at least one of the transistors intervening between the selected transistor and the shared array ground line in each of the affected MAND structures is turned off. Such a configuration has the advantage of being able to be packed much closer together, thus resulting in smaller overall device real estate.

Although the present invention has been described in terms of the presently preferred embodiments, it is to be understood that the disclosure is not to be interpreted as limiting. Various alterations and modifications not disclosed herein may be practiced without departing from the spirit of the invention, or from the invention as set forth in the following claims.

What is claimed is:

1. A programmable erasable memory comprising:
   a bit line;
   a reference voltage point;
   a plurality of memory cells, each having first and second current terminals and a control terminal for controlling current through the first and second current terminals, and further having a conduction threshold settable in accordance with a first potential difference across the control terminal and the first current terminal thereof, the memory cells being serially connected by the first and second current terminals thereof to form a string having at least a first memory cell and a last memory cell, the first current terminal of the first memory cell in the string being coupled to the bit line, and the second current terminal of the last memory cell in the string being coupled to the reference voltage point; and
   a decoder having an address input and a plurality of outputs respectively connected to the control terminals of the memory cells for applying, in response to a memory address on the address input during a program mode, a first voltage to the control terminal of at least a first addressed one of the memory cells in the string and a second voltage to the control terminals of a first subset of memory cells comprising any of the memory cells in the string intervening between the addressed memory cell and the bit line, the second voltage being such as to support conduction in the memory cells of the first subset, and the first voltage being such, relative to a program voltage on the bit line, as to support setting the conduction threshold in the first addressed memory cell without supporting conduction therein.

2. A memory as in claim 1, wherein each of the memory cells is an n-type electrically erasable programmable read only memory ("EEPROM") device, the conduction threshold is a low voltage threshold, and the first voltage is negative relative to the program voltage.

3. A programmable erasable memory comprising:
   a bit line;
   a reference voltage point;
   a plurality of memory cells disposed in a semiconductor substrate, each having first and second current terminals and a control terminal for controlling current through the first and second current terminals, and further having a conduction threshold settable in accordance with a first potential difference across the control terminal and the first current terminal thereof, the memory cells being serially connected by the first and second current terminals thereof to form a string having at least a first memory cell and a last memory cell, the first current terminal of the first memory cell in the string being coupled to the bit line, and the second current terminal of the last memory cell in the string being coupled to the reference voltage point; and
   a decoder having an address input and a plurality of outputs respectively coupled to the control terminals of the memory cells for applying, in response to a memory address on the address input during a conduction threshold set mode, a first voltage to the control terminal of an addressed one of the memory cells in the string, and second voltage(s) to the control terminal(s) respectively of a first subset of memory cell(s) comprising any of the memory cells in the string intervening between the addressed memory cell and the bit line, the second voltage(s) being such as to support conduction in the memory cells of the first subset, and the first voltage being such as to support. setting the conduction threshold in the addressed memory cell to a particular conduction threshold in accordance with a third voltage on the bit line;
   wherein the substrate is a settable potential substrate for receiving a substrate potential during the conduction threshold set mode so that the absolute values of the first and third voltages relative to ground potential are less that the absolute value of the difference between the first and third voltages.

4. A memory as in claim 1 wherein each of the memory cells is an n-type electrically erasable programmable read only memory ("EEPROM") device implemented on a semiconductor substrate, the control terminal being a control gate, the first current terminal being a drain, and the second current terminal being a source.

5. A memory as in claim 4 wherein within the string, adjacent EEPROM devices are connected source-to-source and drain-to-drain, alternately.

6. A memory as in claim 4 wherein within the string, adjacent EEPROM devices are connected source-to-drain, the drain of the first memory cell in the string being coupled to the bit line, and the source of the last memory cell in the string being coupled to the reference voltage point.

7. A programmable erasable memory comprising:
   a bit line;
   a reference voltage point;

a plurality of memory cells, each having first and second current terminals and a control terminal for controlling current through the first and second current terminals, and further having a conduction threshold settable in accordance with a first potential difference across the control terminal and the first current terminal thereof, the memory cells being serially connected by the first and second current terminals thereof to form a string having at least a first memory cell and a last memory cell, the first current terminal of the first memory cell in the string being directly connected to the bit line, and the second current terminal of the last memory cell in the string being directly connected to the reference voltage point; and a decoder having an address input and a plurality of outputs respectively connected to the control terminals of the memory cells for applying, in response to a memory address on the address input during a conduction threshold set mode, a first voltage to the control terminal of at least a first addressed one of the memory cells in the string and a second voltage to the control terminals of a first subset of memory cells comprising the memory cells in the string intervening between the addressed memory cell and the bit line, the second voltage being such as to support conduction in the memory cells of the first subset, and the first voltage being such, relative to a voltage on the bit line, as to support setting the conduction threshold in the first addressed memory cell without supporting conduction therein.

8. A programmable erasable memory comprising:
a bit line;
a reference voltage point;
a plurality of memory cells, each having first and second current terminals and a control terminal for controlling current through the first and second current terminals, and further having a conduction threshold settable in accordance with a first potential difference across the control terminal and the first current terminal thereof, the memory cells being serially connected by the first and second current terminals thereof to form a string having at least a first memory cell and a last memory cell, the first current terminal of the first memory cell in the string being coupled to the bit line, and the second current terminal of the last memory cell in the string being coupled to the reference voltage point; and a decoder having an address input and a plurality of outputs respectively coupled to the control terminals of the memory cells for applying, in response to a memory address on the address input during a conduction threshold set mode, a first voltage to the control terminal of an addressed one of the memory cells in the string, second voltage(s) to the control terminal(s) respectively of a first subset of memory cell(s) comprising any of the memory cells in the string intervening between the addressed memory cell and the bit line, and third voltage(s) to the control terminal(s) respectively of a second subset of memory cell(s) comprising any of the memory cells in the string intervening between the addressed memory cell and the bit line, the second and third voltage(s) being such as to support conduction in the memory cells of the first and second subsets, and the first voltage and the reference voltage being such as to support setting the conduction threshold in the first addressed memory cell to a particular conduction threshold.

9. A memory as in claim 3 wherein each of the memory cells is an n-type electrically erasable programmable read only memory ("EEPROM") device implemented on a semiconductor substrate, the control terminal being a control gate, the first current terminal being a drain, and the second current terminal being a source.

10. A memory as in claim 7, wherein the conduction threshold is a high voltage threshold, and the first voltage is positive relative to the bit line voltage.

11. A memory as in claim 7, wherein the conduction threshold is a low voltage threshold, and the first voltage is negative relative to the bit line voltage.

12. A memory as in claim 7, wherein the outputs of the decoder are further for applying, in response to a memory address on the address input during a read mode, a third voltage to the control terminal of a second addressed one of the memory cells in the string and fourth voltages to the control terminals of a second subset of the memory cells intervening in the string between the second addressed memory cell and the bit line, and between the second addressed memory cell and the reference voltage point, the fourth voltage being such as to support conduction in the memory cells of the second subset, and the third voltage being such as to support sensing the conduction threshold in the second addressed memory cell.

13. A memory as in claim 11 wherein:
the memory cells are field effect devices fabricated in a semiconductor substrate, each having a control gate coupled to the control terminals, a floating gate, and a channel region in the substrate between a source and a drain, under electrostatic control of the control gate and the floating gate; and
wherein a substrate potential is applied to the substrate.

14. A memory as in claim 13 wherein the substrate potential is a ground potential.

15. A memory as in claim 13, wherein the substrate potential is variable so that the absolute values of the first and third voltages relative to ground potential are less that the absolute value of the difference between the first and third voltages.

16. A memory as in claim 7 wherein each of the memory cells is an n-type electrically erasable programmable read only memory ("EEPROM") device implemented on a semiconductor substrate, the control terminal being a control gate, the first current terminal being a drain, and the second current terminal being a source.

17. A memory as in claim 16 wherein within the string, adjacent EEPROM devices are connected source-to-source and drain-to-drain, alternately.

18. A memory as in claim 16 wherein within the string, adjacent EEPROM devices are connected source-to-drain, the drain of the first memory cell in the string being directly connected to the bit line, and the source of the last memory cell in the string being connected to the reference voltage point.

19. A memory as in claim 16 wherein the outputs of the decoder are further for applying, during an erase mode, a fourth voltage to the substrate and fifth voltages to the control gates of the memory cells, the fifth voltage being positive relative to the fourth voltage and of a magnitude to support tunneling in an EEPROM device.

20. A memory as in claim 19 wherein the outputs of the decoder are further for applying, during an erase mode, a sixth voltage to the bit line and a seventh voltage to the reference point, the sixth and seventh voltages being non-negative relative to the fourth voltage to prevent leakage.

21. A method of programming a NAND array of memory cells coupled to a bit line and having respective settable voltage thresholds, comprising:
    erasing the memory cells in the NAND array to set the respective voltage thresholds thereof at a high threshold indicative of a first logical state;
    selecting one of the memory cells for programming;
    applying a first voltage to the bit line, the first voltage having a value dependent on a logical state for programming the selected memory cell;
    applying a second voltage to the selected memory cell;
    when any of the memory cells intervene between the selected memory cell and the bit line, applying a third voltage to the intervening memory cell(s), the third voltage being such as to support conduction in the intervening memory cells of the first subset without disturbing the voltage thresholds thereof, the second voltage being such, relative to the first voltage, as to set the voltage threshold of the selected memory cell to a low voltage threshold when the first voltage is indicative of a second logical state which is a complement of the first logical state, and not disturb the voltage threshold of the selected memory cell when the first voltage is indicative of the first logical state.

22. A method as in claim 21 wherein the memory cells are electrically erasable programmable read-only memory ("EEPROM") cells disposed in a semiconductor substrate, further comprising applying a potential to the substrate so that the absolute values of the first and second voltages relative to ground potential are less that the absolute value of the difference between the first and third voltages.

23. A NAND array of memory cells coupled to a bit line and having respective settable voltage thresholds, comprising:
    means for erasing the memory cells in the NAND array to set the respective voltage thresholds thereof at a high threshold indicative of a first logical state;
    means for selecting one of the memory cells for programming;
    means for applying a first voltage to the bit line, the first voltage having a value dependent on a logical state for programming the selected memory cell;
    means for applying a second voltage to the selected memory cell;
    means for applying, when any of the memory cells intervene between the selected memory cell and the bit line, a third voltage to the intervening memory cell(s), the third voltage being such as to support conduction in the intervening memory cells of the first subset without disturbing the voltage thresholds thereof, the second voltage being such, relative to the first voltage, as to set the voltage threshold of the selected memory cell to a low voltage threshold when the first voltage is indicative of a second logical state which is a complement of the first logical state, and not disturb the voltage threshold of the selected memory cell when the first voltage is indicative of the first logical state.

24. A NAND array as in claim 23 wherein the memory cells are electrically erasable programmable read-only memory ("EEPROM") cells disposed in a semiconductor substrate, further comprising means for applying a potential to the substrate so that the absolute values of the first and second voltages relative to ground potential are less that the absolute value of the difference between the first and third voltages.

* * * * *